United States Patent [19]
Pittman

[11] 3,936,730
[45] Feb. 3, 1976

[54] INSULATION TEST APPARATUS INCLUDING IMPROVED MEANS FOR SIMULTANEOUS DISPLAY

[75] Inventor: Paul F. Pittman, Pittsburgh, Pa.

[73] Assignee: Westinghouse Electric Corporation, Pittsburgh, Pa.

[22] Filed: May 24, 1971

[21] Appl. No.: 146,233

[52] U.S. Cl. .................................................. 324/54
[51] Int. Cl.² ........................................ G01R 31/14
[58] Field of Search ................... 324/54, 55, 158 D

[56] References Cited
UNITED STATES PATENTS

| | | | |
|---|---|---|---|
| 2,478,414 | 8/1949 | Michal | 324/54 |
| 2,480,881 | 9/1949 | Schleif | 324/55 |
| 2,532,336 | 12/1950 | Rufolo | 324/54 |
| 2,569,990 | 10/1951 | Harter | 324/54 |
| 2,890,410 | 6/1959 | Holcomb | 324/54 |
| 2,935,676 | 5/1960 | Keltz | 324/158 D UX |
| 3,045,177 | 7/1962 | Weed | 324/54 |
| 3,200,392 | 8/1965 | Chumakov | 324/158 D |
| 3,546,581 | 12/1970 | Herrendeen et al. | 324/54 |

*Primary Examiner*—Gerard R. Strecker
*Attorney, Agent, or Firm*—G. H. Telfer

[57] ABSTRACT

In apparatus for the high frequency voltage testing of insulation on conductors, a display technique is disclosed in which a plurality of insulated conductors under test are in mutually parallel circuit branches all connected in a single capacitor discharge circuit and associated with means for simultaneously displaying signals indicative of current variations in each of the parallel circuit branches. This technique of simultaneous display not only minimizes the components in the circuit but more importantly provides a more sensitive and faster responding test apparatus.

7 Claims, 3 Drawing Figures

INSULATION TEST APPARATUS INCLUDING IMPROVED MEANS FOR SIMULTANEOUS DISPLAY

BACKGROUND OF THE INVENTION

1. Field of the Invention

The invention relates to insulation test apparatus in which an insulated conductor under test is subjected to a high frequency voltage producing a waveform whose characteristics indicate the quality of insulation on the conductor.

2. Prior Art

High frequency voltage testing of insulated conductors is a well established technique and is widely used for checking the quality of the insulation used in dynamoelectric machine coils. The general technique involves discharging a capacitor into the coil and observing the frequency and Q of discharge voltage or current. The test also serves to identify coils which by accident may have more or fewer turns than they are supposed to have. The basic technique is described in an article by J. L. Rylander in *Transactions of the AIEE*, Feb. 1926, pages 459 to 465. Reference may also be made to copending application Ser. No. 146,234, filed May 24, 1971, U.S. Pat. No. 3,731,185, issued May 1, 1973, by the present inventor and assigned to the present assignee, which further discusses the background of this type of apparatus and discloses an improvement with respect to the manner in which capacitor discharge is effected.

In the apparatus originally disclosed by Rylander and as widely used the indication of discharge frequency is obtained by a wave meter. Similar apparatus has been constructed by P. Mylner and J.E. Macko, in unpublished work, using certain improvements over the original apparatus of Rylander including displaying the voltage of the capacitor on an oscilloscope as a discharge, facilitating the measurement of the discharge frequency and the circuit Q.

Further modified apparatus has been at least demonstrated by a manufacturer prior to the present invention, that includes (as schematically illustrated in FIG. 1) essentially two complete discharge circuits 10 and 20 and includes provisions for connection of a test coil 11 and 21 within each of the discharge circuits. By using a current transformer 12 on the common ground branch of the two circuits 10 and 20 and triggering them alternately, a display of the discharge current in each of the two coils alternately, but rapidly, appears on an oscilloscope 15. If one coil has faulty insulation or the wrong number of turns, it is easily detected by noticing the difference in the forms of the two traces.

The provision of duplicate discharge circuits is unattractive from a size and ecomony standpoint and the purposes of achieving a simultaneous display without such duplication led to the making of the present invention.

SUMMARY

The present invention, briefly, concerns an improved display technique particularly for insulation test apparatus of the high frequency voltage type. According to the invention there are provided means to connect a plurality of insulated conductors under test respectively in mutually parallel circuit branches which are all connected in a single capacitor discharge circuit. means such as current transformers are associated with each of the parallel circuit branches for sensing current variations in each of those branches. The signals from the sensing means are applied to display means, such as an oscilloscope, for simultaneously displaying signals representing the condition of each of the conductors under test.

By this display technique there is not only avoided the need for multiple discharge circuits but additionally a simultaneous display is provided with superior sensitivity in its ability to demonstrate small differences in coil inductance.

DRAWING

FIG. 1 is a schematic diagram of a circuit of insulation test apparatus illustrating features of the prior art previously referred to;

PREFERRED EMBODIMENTS

Figure 2:
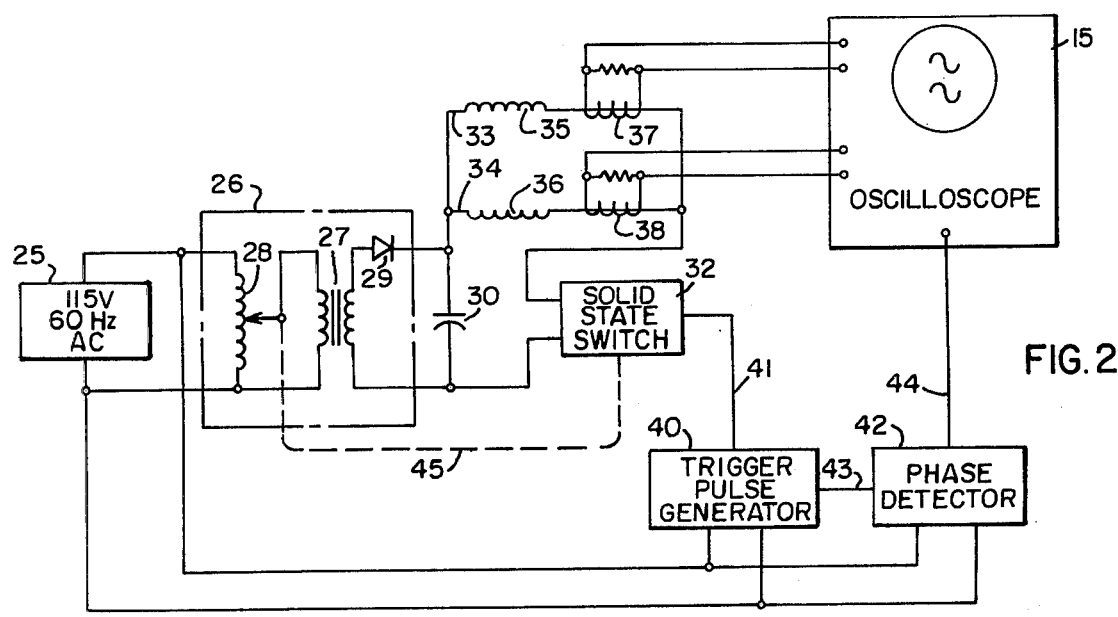
FIG. 2 is a schematic diagram of a test circuit including the display technique provided by the present invention.

Referring to FIG. 2, apparatus in accordance with this invention is illustrated in schematic form for a complete high frequency tester. Operation of the complete circuit will be explained with reference to the voltage waveform shown in FIG. 3 which provides timing information.

The apparatus of FIG. 2 is intended for operation from a usual 115 volt, 60 hertz, supply 25, although another type of supply may be used. The supply 25 is connected across a capacitor charging circuit 26 which in this example includes a transformer 27 with, on its primary side, a variably adjustable winding 28 for varying the primary voltage level and on the secondary side a diode or other rectifying means 29 to provide at the output of the charging circuit a predetermined direct voltage level.

Capacitor 30 is connected across the charging circuit 26. In circuit with the capacitor is a switching means 32 which is preferably a solid state switch including a series string of a plurality of semiconductor switches of the four-layer type, preferably reverse switching rectifiers, as disclosed in the above referred to copending application Ser. No. 146234. Also in circuit with the capacitor are a plurality of mutually parallel circuit branches 33 and 34 that each include an insulated conductor 35 and 36, respectively, under test. Each branch 33 and 34 has associated with it a means, such as a current transformer, 37 and 38, respectively, for sensing current variations in each of the parallel circuit branches and supplying signals thereof to display means such as an oscilloscope for simultaneous display of those signals.

The circuit also includes a trigger pulse generator 40 connected across the supply lines that comprises means in accordance with known techniques for applying a trigger pulse to the solid state switching means 32 on line 41. Additionally, a phase detector 42, of known type, is connected across the supply lines and associated with the trigger pulse generator on line 43 and the trigger circuit of oscilloscope 15 on line 44.

Figure 3:
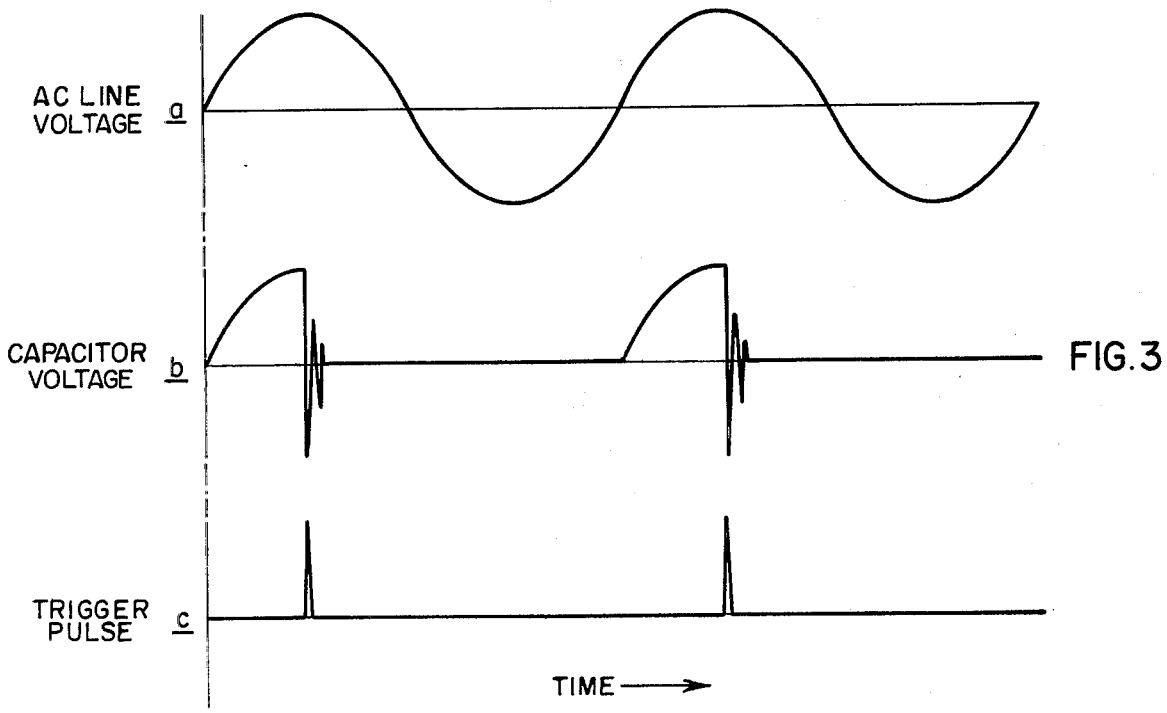
FIG. 3 is a set of waveforms illustrating timing functions in the performance of the circuit of FIG. 2.

As the AC line voltage goes positive, as shown in FIG. 3(*a*), the energy storage capacitor 30 is charged as shown in FIG. 3(*b*), by current flowing through the diode 29. At the same time, the AC line voltage is applied in phase to the phase detector 42 which contains circuitry to sense the occurrence of the peak. Sh9rtly after the peak of the line voltage has been reached and capacitor 30 has been fully charged, the phase detector 42 provides a signal to the trigger pulse generator 40 as shown in FIG. 3(c). The trigger pulse generator then applies an amplified trigger pulse to the solid state switch 32, causing it to close and discharge the energy storage capacitor 30 into the coils under test. During the negative half cycle of the AC line voltage capacitor 30 is not charged and no transient is generated.

The apparatus includes preferably a solid state switch in accordance with the above-mentioned copending application which is mechanically associated by coupling 45 with a variable winding 28 on the primary side of the transformer so that as voltage is changed the number of triggerable switching devices changes.

For operator convenience, it is desirable to display the discharge transient on an oscilloscope. Because the transient is repetitive at a rate of 60 hertz, a stable oscilloscope display may easily be obtained using the output of the phase detector 42 as the oscilloscope synchronization signal.

The display technique of this invention is superior in accuracy and operator convenience to those previously used. It involves discharging the energy storage capacitor into at least two coils connected in parallel as shown in the drawing. A current transformer on each of the parallel branches 33 and 34 provides voltage signals proportional to the currents in each of the conductors under test and are connected to the inputs of the two channel oscilloscope 15 synchronized in the manner described.

With this type of circuit connection, two distinctly different types of displays are possible. There may be provided an alternate sweep display in which the oscilloscope is adjusted to sweep alternately between the outputs of the two current transformers. This can be performed so rapidly in commercially available oscilloscopes that it seems to be displayed simultaneously for both coils under test. This type of display provides a comparison between a reference coil and a coil not yet tested. It is superior in regard to readability and sensitivity compared to the display which alternately presents the currents of two test coils excited from two entirely separate discharge circuits. Also, more than two test coils can be simultaneously tested this way.

The circuit of this invention also permits a differential display in which the oscilloscope used includes the feature of displaying a signal which is the difference between the input supplied to the two vertical channels, or the differential signal. When this method of display is used, two similar test coils provide almost no differential signal, while two test coils with different inductances result in a signal of large amplitude. When this method of display is used the oscilloscope gain may be increased considerably so that small differences in coil inductance which would be undetectable by any other display technique may easily be seen. One condideration in using this mode of display is that an acceptable coil yields no differential signal as would also be the case if the oscilloscope malfunctioned. Thus, periodic checks to insure normal operation are required.

A differential display technique may be app.ied in a level detector and is used to detect a variation of a given magnitude between two coils with indicia means (such as an electric lamp or an audible signal) connected to indicate the existence of such a variation to an operator.

The superior sensitivity of the display circuit in accordance with this invention to differences in coil inductance can be shown analytically in the following way. Assume that the inductances of the two test coils are related in the following manner:

$$L_2 = L_1 (1 + \delta)$$

where $L_1$ and $L_2$ are the inductance of the respective test coils and $\delta$ is a dimensionless factor.

When operated in the circuit shown in FIG. 2, the peak coil currents are related as follows:

$$\frac{I_2 \text{ peak}}{I_1 \text{ peak}} \cong 1 - \delta$$

for $\delta << 1$

Figure 1:
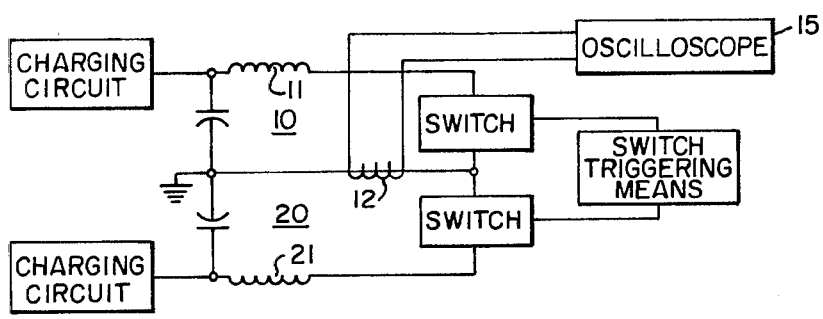

However, when two separate pulse circuits are used as in FIG. 1, coil peak currents are related as follows:

$$\frac{I_2 \text{ peak}}{I_1 \text{ peak}} = \sqrt{1 - \delta}$$

for $\delta << 1$

The display technique in accordance with this invention is therefore more sensitive than that of the prior art by a factor of the reciprocal of $\sqrt{1 - \delta}$.

Since the period of oscillation of discharge currents is the same in both coils under test in the present invention, no information is provided regarding coil inductance. In the apparatus of Fig. 1 in which there are separate discharge circuits, the periods differ, but their ratio is still equal to $\sqrt{1 + \delta}$ so that it is no more sensitive than the indication of peak current in indicating inductance.

Apparatus in accordance with this invention has been constructed and successfully operated and found less complex and less expensive as well as functionally superior to other known approaches.

I claim:

1. In insulation test apparatus wherein a capacitor discharge applies a high frequency voltage to an insulated conductor under test and producing a waveform whose characteristics, including frequency, indicate the quality of insulation on the conductor, the improvement comprising:
    means to connect a plurality of insulated conductors under test respectively in mutually parallel circuit branches which are all connected in a single capacitor discharge circuit; means for sensing current variations in each of said parallel circuit branches; means for displaying signals from each of said means for sensing current variations.

2. The subject matter of claim 1 wherein:
    said single capacitor discharge circuit comprises a capacitor that is also connected in a charging circuit to charge it to a desired voltage level, switching means to close said discharge circuit, and two of said mutually parallel circuit branches, each for a separate insulated conductor under test.

3. The subject matter of claim 2 wherein:
    said means for sensing current variations in each of sapid parallel circuit branches is a current transformer and said means for displaying signals is an oscilloscope.

4. The subject matter of claim 2 wherein:

said switching means comprises a plurality of semiconductor switching devices of the four layer type connected in a series string and provided with means to trigger said series string to conduction to effect discharge of said capacitor.

5. The subject matter of claim 1 wherein:
said means for displaying signals has alternately applied thereto signals from each of said means for sensing current variations at a rate to produce an apparent simultaneous display.

6. The subject matter of claim 1 wherein:
said means for displaying signals has means to develop a signal representing the difference of two parallel circuit branches and to display that difference signal.

7. The subject matter of claim 6 wherein:
said apparatus further comprises indicia means to indicate the existence of a given magnitude of difference signal.

* * * * *